(12) United States Patent
Tsuchiya et al.

(10) Patent No.: US 7,535,628 B2
(45) Date of Patent: May 19, 2009

(54) LASER LIGHT SOURCE, METHOD OF LASER OSCILLATION, AND METHOD OF LASER PROCESSING

(75) Inventors: Ichiro Tsuchiya, Yokohama (JP); Motoki Kakui, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 346 days.

(21) Appl. No.: 11/417,253

(22) Filed: May 4, 2006

(65) Prior Publication Data

US 2006/0257150 A1 Nov. 16, 2006

(30) Foreign Application Priority Data

May 9, 2005 (JP) ............................ P2005-136500

(51) Int. Cl.
*H01S 4/00* (2006.01)
*H01S 3/00* (2006.01)

(52) U.S. Cl. ............................ 359/333; 372/18; 372/19; 372/23

(58) Field of Classification Search ................. 359/333; 372/18, 19, 23
See application file for complete search history.

(56) References Cited

U.S. PATENT DOCUMENTS

| | | | | |
|---|---|---|---|---|
| 5,479,422 A | * | 12/1995 | Fermann et al. | 372/18 |
| 5,708,670 A | * | 1/1998 | Pfeiffer | 372/18 |
| 5,917,625 A | * | 6/1999 | Ogusu et al. | 358/24 |
| 6,946,620 B2 | * | 9/2005 | Amako et al. | 219/121.75 |
| 2002/0044723 A1 | * | 4/2002 | Hironishi | 385/24 |
| 2004/0033004 A1 | * | 2/2004 | Welch et al. | 385/14 |

OTHER PUBLICATIONS

Chen, M.-Y., et al. "27-mJ nanosecond pulses in $M^2 = 6.5$ beam from a coiled highly multimode Yb-doped fiber amplifier" CLEO'2004 Technical Digest CTuS4, pp. 1-3.

Limpert, J., et al. "Extended large-mode-area single-mode microstructured fiber laser" CLEO'2004 Technical Digest CMS6, pp. 1-2.

* cited by examiner

*Primary Examiner*—Eric Bolda
(74) *Attorney, Agent, or Firm*—McDermott Will & Emery LLP (57) ABSTRACT

A laser light source includes a light source section for outputting pulse laser light $\lambda_1$, $\lambda_2$ with a mutually identical repetition frequency, an optical amplification section for amplifying and outputting the pulse laser light $\lambda_1$, $\lambda_2$ output from the above light source section by means of a common optical amplification medium, an optical demultiplexing section for mutually demultiplexing pulse laser light $\lambda_1$, $\lambda_2$, an optical multiplexing section for multiplexing and outputting the pulse laser light $\lambda_1$, $\lambda_2$ demultiplexed in the above optical demultiplexing section, and an optical path length difference setting section for adjusting an optical path length difference between the pulse laser light $\lambda_1$, $\lambda_2$ in between the optical demultiplexing section and the optical multiplexing section.

20 Claims, 10 Drawing Sheets

LASER LIGHT SOURCE, METHOD OF LASER OSCILLATION, AND METHOD OF LASER PROCESSING

BACKGROUND OF THE INVENTION

1. Field of the Invention

The present invention relates to a laser light source, a laser oscillation method and a laser processing method suitable for processing use (processing, reformation, cleaning, and the like). Also, the present invention is effective for measurement of a long distance and destruction of an object to be measured which require a high output light source.

2. Related Background of the Invention

The laser light source is used not only for communication but also for processing. The laser light source for processing use (in particular, microfabrication) requires large mean power of the output laser light, excellent quality $M^2$ of the output laser light, large peak power of the output laser light, and large pulse energy of the output laser light.

For example, a laser light source having been disclosed in "27-mJ nanosecond pulses in M2=6.5 beam from a coiled highly multimode Yb-doped fiber amplifier", M.-Y Chen, et al., CLEO'2004 Technical Digest, CTuS4, or "Extended large-mode-areasingle-mode microstructured fiber laser", Limpert, et al., CLEO'2004 Technical Digest, CMS6, is configured of a MOPA (Master Oscillator Power Amplifier) structure, which includes a light source section for outputting pulse laser light and an optical amplification section for amplifying and outputting pulse laser light output from the above light source section by means of an optical amplification medium, and can be employed for processing use.

Now, to perform laser processing on a processing object with precision, a pulse shape of the pulse laser light output from the laser light source is also important. For example, when performing laser processing of metal, it may be considered that, at an early stage, the metal is melted with peak power of a considerably low level in each pulse of pulse laser light, and thereafter, at a later stage, pulse energy is set high, so as to eliminate the melted metal by vaporization at a stroke. Also, it may be considered that two pulses of light, for example, are used as one set, and in each set, after processing by use of the pulse light in the first stage, reattachment of eliminated scrap is avoided by irradiating with the pulse light of low energy in the second stage. As such, it is preferable for processing use that the pulse laser light output from a laser light source can be set to a more suitable pulse shape, pulse intervals or pulse energy.

However, in the conventional laser light sources including the ones described in the above two papers, there has been no degree of freedom in regard to the above point. Owing to this, in laser processing using the conventional laser light sources, there may be the case that processing a processing object with precision cannot be performed.

SUMMARY OF THE INVENTION

The present invention is created for overcoming the abovementioned problem, and it is an object of the present invention to provide a laser light source capable of performing more precise laser processing, and a laser oscillation method and a laser processing method using the above laser light source.

The laser light source in according to the present invention is characterized by including a light source section outputting pulse laser light of a first wavelength and pulse laser light of a second wavelength at a first pulse period and a second pulse period, respectively; an optical amplification section amplifying and outputting the pulse laser light of the first wavelength and the pulse laser light of the second wavelength being output from the light source section by means of a common optical amplification medium; an optical demultiplexing section mutually demultiplexing the pulse laser light of the first wavelength and the pulse laser light of the second wavelength being output from the optical amplification section; an optical multiplexing section multiplexing and outputting the pulse laser light of the first wavelength and the pulse laser light of the second wavelength being demultiplexed in the optical demultiplexing section; and an optical-path length difference setting section setting an optical-path length difference between the pulse laser light of the first wavelength and the pulse laser light of the second wavelength in between the optical demultiplexing section and the optical multiplexing section.

Additionally, the setting of the optical path length difference by the optical path length difference setting section includes the case of adjusting and fixing at the factory, the case of semi-fixing by securing the optical path length difference to a certain order in a fiber and fine tuning through spatial adjustment, and the case of variable setting freely adjustable by a customer.

In the above laser light source, the pulse laser light of the first wavelength and the pulse laser light of the second wavelength being output from the light source section have frequencies to be restored to the original states at a predetermined period, which are optically amplified together by a common optical amplification medium included in the optical amplification section, and thereafter mutually demultiplexed in the optical demultiplexing section. The pulse laser light of the first wavelength and the pulse laser light of the second wavelength being demultiplexed in the optical demultiplexing section are multiplexed and output from the optical multiplexing section, after the optical path length difference therebetween is set in the optical path length difference setting section. According to the respective pulse shapes, a mutual interval and a set amount of the optical path length difference by the optical path length difference setting section in regard to the pulse laser light of the first wavelength and the pulse laser light of the second wavelength being output from the light source section, it becomes possible that the pulse laser light multiplexed and output from the optical multiplexing section is set to have more suitable pulse shape, pulse interval and pulse energy.

The light source section of the laser light source according to the present invention preferably includes a first light source outputting the pulse laser light of the first wavelength; a second light source outputting the pulse laser light of the second wavelength; and an optical multiplexer multiplexing and outputting the pulse laser light of the first wavelength output from the first light source and the pulse laser light of the second wavelength output from the second light source. In this case, the pulse laser light of the first wavelength is output from the first light source, and also the pulse laser light of the second wavelength is output from the second light source, and the above pulse laser light of the first wavelength and the above pulse laser light of the second wavelength are multiplexed in the optical multiplexer and output from the light source section.

The light source section of the laser light source according to the present invention preferably includes a mode-locked fiber laser light source. In this case, each of the first wavelength and the second wavelength becomes stable, and accordingly, the operation of the laser light source becomes stable.

The light source section of the laser light source according to the present invention preferably includes an oscillation interval control mechanism controlling input timing of the pulse laser light of the first wavelength and the pulse laser light of the second wavelength to be input to the optical amplification section. Also, preferably, the optical amplification section is a rare earth element-doped optical fiber amplifier. In the above cases, each of the pulse laser light of the first wavelength and the pulse laser light of the second wavelength is optically amplified in the optical amplification section with high gain.

According to the present invention, preferably, the pulse laser light of the first wavelength and the pulse laser light of the second wavelength are multiplexed in the optical multiplexing section of the laser light source after being spatially propagated. In this case, high-power pulse laser light can be formed or generated without taking into consideration a nonlinear limit of the optical fiber. Further, preferably, the optical amplification section includes an optical fiber having one propagation mode in number in the first wavelength and the second wavelength, and the quality $M^2$ of the light multiplexed and output from the optical multiplexing section is 1.5 or less.

The optical path length difference setting section of the laser light source according to the present invention preferably includes an optical waveguide adjusting an optical path length in at least a portion of either both or one of the optical path of the pulse laser light of the first wavelength and the optical path of the pulse laser light of the second wavelength. In this case, by adjusting an optical waveguide length, it is possible to adjust the optical path length difference between the pulse laser light of the first wavelength and the pulse laser light of the second wavelength in between the optical multiplexing section and the optical demultiplexing section. Further, preferably, the optical path length difference setting section includes a variable optical-path length difference adjusting section by which an adjustment amount of the optical path length difference is variable.

A laser oscillation method according to the present invention is characterized by including the steps of: outputting pulse laser light of a first wavelength and pulse laser light of a second wavelength from a light source section of which frequencies are restored to the original states at a predetermined period; amplifying and outputting the pulse laser light of the first wavelength and the pulse laser light of the second wavelength being output from the light source section by a common optical amplification medium in an optical amplification section; mutually demultiplexing in an optical demultiplexing section the pulse laser light of the first wavelength and the pulse laser light of the second wavelength being output from the optical amplification section; in an optical path length difference set section, setting an optical path length difference between the pulse laser light of the first wavelength and the pulse laser light of the second wavelength being demultiplexed in the optical demultiplexing section; and in an optical multiplexing section, multiplexing and outputting the pulse laser light of the first wavelength and the pulse laser light of the second wavelength, of which optical path length difference is set in the optical path length difference setting section.

The laser oscillation method according to the present invention preferably includes the steps of: outputting from the optical demultiplexing section the pulse laser light of the first wavelength and the pulse laser light of the second wavelength with mutually different timing; and outputting from the optical multiplexing section the pulse laser light of the first wavelength and the pulse laser light of the second wavelength with such timing that at least portions thereof mutually overlap. Further, preferably, the pulse group shape of the pulse laser light output from the optical multiplexer is formed to a desired shape by adjusting either one or more of the respective pulse widths, power and output timing of the pulse laser light of the first wavelength and the pulse laser light of the second wavelength being output from the light source section. Also, preferably, the pulse group shape of the pulse laser light output from the optical multiplexer is modified by adjusting the setting of the optical path length difference in the optical path length difference setting section. Here, the pulse group shape designates a shape of an individual pulse component (i.e. width and power of a pulse component) forming the pulse group, and an interval between the pulse components (an output timing difference of the pulse components).

Further, a laser processing method according to the present invention is characterized by including processing a processing object by irradiating the processing object with pulse laser light being output by means of the laser oscillation method according to the above-mentioned present invention.

DESCRIPTION OF THE PREFERRD EMBODIMENTS

Hereinafter, the preferred embodiments of the present invention will be described in detail referring to the attached drawings. In the description of the drawings, like reference numerals are attached to like elements, and duplicated descriptions thereof are omitted.

Figure 1:
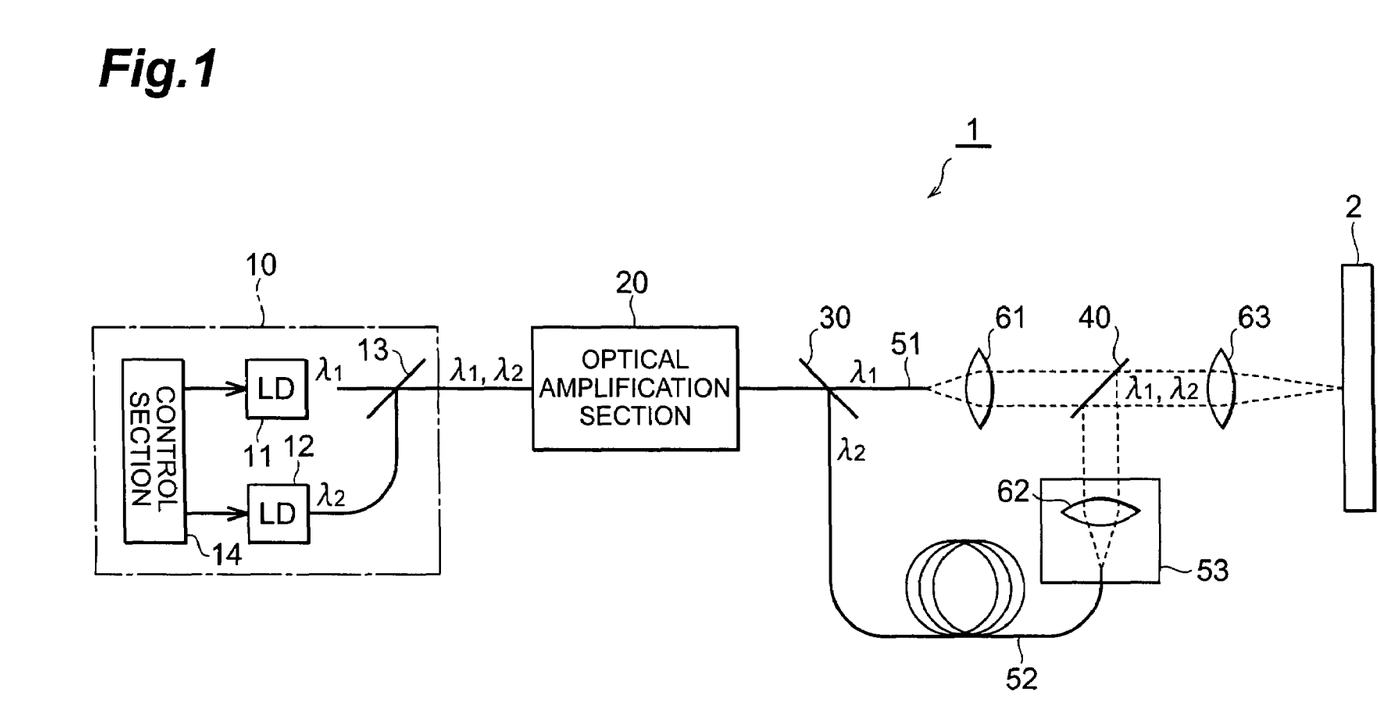
FIG. 1 shows a configuration diagram of a laser light source 1 according to the present embodiment.

FIG. 1 shows a configuration diagram of a laser light source 1 according to the present embodiment. The laser light source 1 shown in this figure is provided for processing a processing object 2 by irradiating the processing object 2 with pulse laser light, and includes light source section 10, optical amplification section 20, optical demultiplexing section 30, optical multiplexing section 40 and optical path length difference setting section 50.

The light source section 10 outputs pulse laser light having a first wavelength $\lambda_1$ (hereinafter denoted as 'pulse laser light $\lambda_1$') and pulse laser light having a second wavelength (hereinafter denoted as 'pulse laser light $\lambda_2$') of which frequencies are restored to original states at a predetermined period. More specifically, the light source section 10 includes a first light source 11, a second light source 12, an optical multiplexer 13 and a control section 14. The first light source 11 outputs pulse laser light $\lambda_1$. The second light source 12 outputs pulse laser light $\lambda_2$. Each of the first light source 11 and the second light source 12 preferably includes either a laser diode to be directly modulated and driven, or a laser diode to be driven continuously and an external modulator. The optical multiplexer 13 receives the pulse laser light $\lambda_1$ output from the first light source 11, and also receives the pulse laser light $\lambda_2$ output from the second light source 12, and then multiplexes, and outputs, the above pulse laser light $\lambda_1$ and the pulse laser light 2. The control section 14 adjusts one or more of a pulse width, a mutual interval and power in regard to the pulse laser light $\lambda_1$, output from the first light source 11 and the pulse laser light $\lambda_2$ the second light source 12, respectively. The $\lambda_1$, $\lambda_2$ may be set into a range capable of being amplified in the optical amplification section 20 and demultiplexed and multiplexed in the optical demultiplexing section 30 and the optical multiplexing section 40, respectively.

The optical amplification section 20 receives the pulse laser light $\lambda_1$ and the pulse laser light $\lambda_2$ multiplexed and output from the optical multiplexer 13 of the light source section 10, and amplifies and outputs the pulse laser light $\lambda_1$ and the pulse laser light $\lambda_2$ by a common amplification medium. The optical amplification section 20 preferably includes a rare earth element-doped optical fiber amplifier which includes an optical fiber having a rare earth element being doped in an optical waveguide region as an optical amplification medium. Also, the above optical amplification section 20 preferably includes multistage optical amplification media, though an optical amplification section having a single-stage optical amplification medium may also be chosen.

The optical demultiplexing section 30 mutually demultiplexes the pulse laser light $\lambda_1$ and the pulse laser light $\lambda_2$ being output from the optical amplification section 20, making the pulse laser light $\lambda_1$ incident on one end of an optical fiber 51, while making the pulse laser light 2 incident on one end of an optical fiber 52. A lens 61 collimates the pulse laser light $\lambda_1$ output from the other end of the optical fiber 51. A lens 62 collimates the pulse laser light $\lambda_2$ output from the other end of the optical fiber 52.

The optical multiplexing section 40 receives the pulse laser light $\lambda_1$ collimated by the lens 61, and also receives the pulse laser light 2 collimated by the lens 62, and multiplexes and outputs the above pulse laser light $\lambda_1$ with the pulse laser light 2. The lens 63 receives the pulse laser light $\lambda_1$ and the pulse laser light $\lambda_2$ multiplexed and output from the optical multiplexing section 40, and converges the pulse laser light $\lambda_1$ and the pulse laser light $\lambda_2$, so as to collect the light and irradiate the processing object 2.

The optical path length difference setting section 50 is provided for setting the optical path length difference between the pulse laser light $\lambda_1$ and the pulse laser light $\lambda_2$ in between the optical demultiplexing section 30 and the optical multiplexing section 40. The above optical path length difference setting section 50 includes the optical fiber 51 and the optical fiber 52 having different lengths, and a spatial optical path length variation section 53. The optical path length of the pulse laser light $\lambda_1$ from the optical demultiplexing section 30 to the optical multiplexing section 40 includes the optical path length of the optical fiber 51 and the other optical path length in the spatial transmission portion. The optical path length of the pulse laser light 2 from the optical demultiplexing section 30 to the optical multiplexing section 40 includes the optical path length of the optical fiber 52 and the other optical path length in the spatial transmission portion.

By adjusting the respective optical fiber path lengths of the optical fibers 51, 52 and the spatial optical path length of the spatial transmission portion, it becomes possible to adjust the overall optical path length difference between the pulse laser light $\lambda_1$ and the pulse laser light $\lambda_2$ in between the optical demultiplexing section 30 and the optical multiplexing section 40. The spatial optical path length variation section 53 can move the output end of the optical fiber 52 and the lens 62 integrally to the optical axis direction thereof. With the above movement, it becomes possible to obtain a variable adjustment amount of the optical path length difference between the pulse laser light $\lambda_1$ and the pulse laser light $\lambda_2$ in between the optical demultiplexing section 30 and the optical multiplexing section 40.

Figure 2:
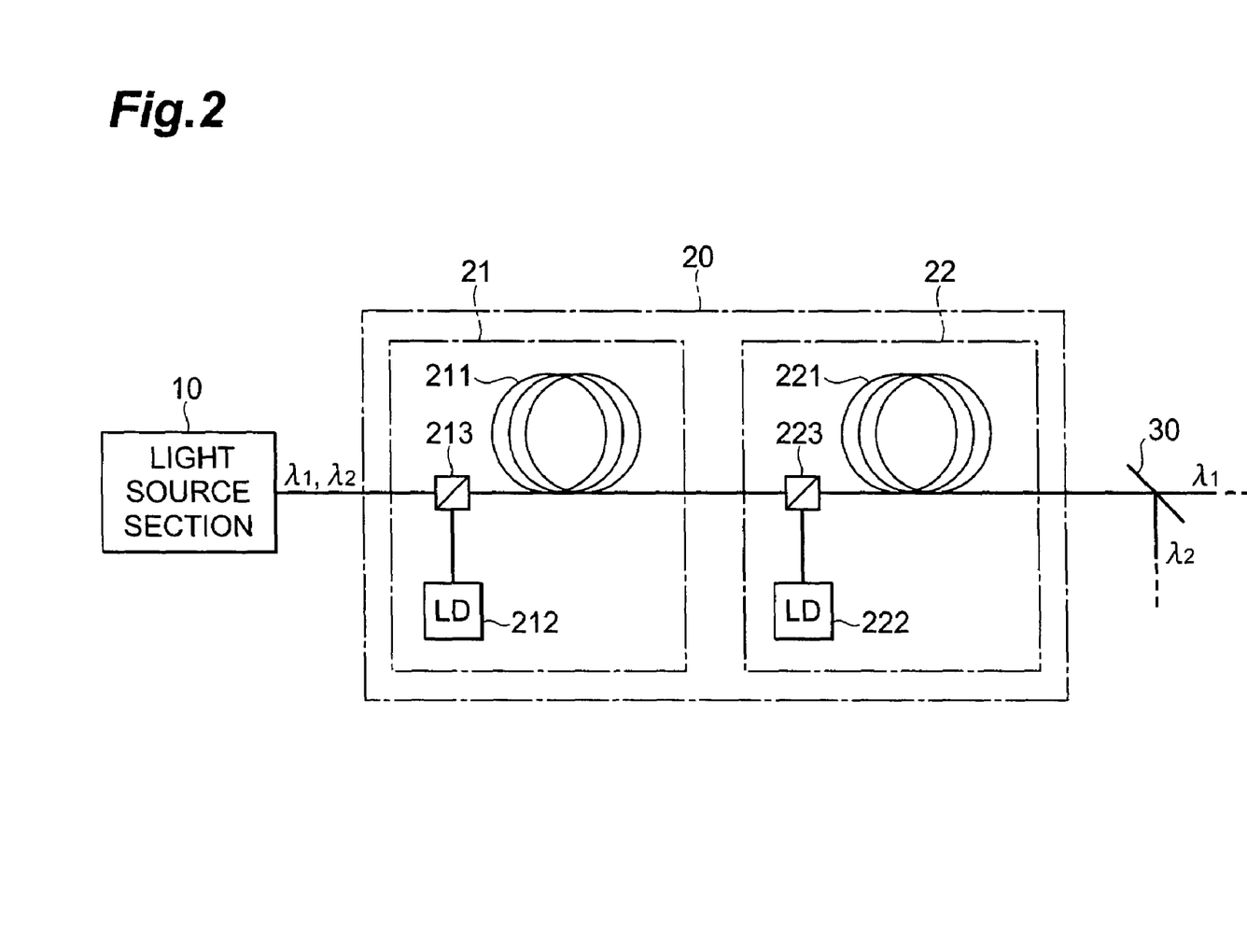
FIG. 2 shows a configuration diagram of an optical amplification section 20 included in the laser light source 1 according to the present embodiment.

FIG. 2 shows a configuration diagram of the optical amplification section 20 included in the laser light source 1 according to the present embodiment. As shown in this figure, preferably, the optical amplification section 20 has a two-stage configuration including a preamplifier 21 and a power amplifier 22. Also, preferably, each of the preamplifier 21 and the power amplifier 22 includes a rare earth element-doped optical fiber amplifier having a rare earth element-doped optical fiber as an optical amplification medium.

The preamplifier 21 includes a rare earth element-doped optical fiber 211, an excitation light source 212 and an optical coupler 213. The excitation light source 212 continuously outputs excitation light having a wavelength capable of exciting the rare earth element being doped in the rare earth element-doped optical fiber 211, which is preferably a laser diode. The optical coupler 213 supplies the excitation light output from the excitation light source 212 to the rare earth element-doped optical fiber 211, and also makes the pulse laser light $\lambda_1$ and the pulse laser light $\lambda_2$ being output from the light source section 10 be incident on the rare earth element-doped optical fiber 211. The rare earth element-doped optical fiber 211 then optically amplifies the above pulse laser light $\lambda_1$ and the pulse laser light $\lambda_2$ together, and outputs to a main amplifier 22.

The main amplifier 22 includes a rare earth element-doped optical fiber 221, an excitation light source 222 and an optical coupler 223. The excitation light source 222 continuously outputs excitation light having a wavelength capable of exciting the rare earth element being doped in the rare earth element-doped optical fiber 221, which is preferably a laser diode. The optical coupler 223 supplies the excitation light output from the excitation light source 222 to the rare earth element-doped optical fiber 221, and also makes the pulse laser light $\lambda_1$ and the pulse laser light $\lambda_2$ being output from the preamplifier 21 be incident on the rare earth element-doped optical fiber 221. The rare earth element-doped optical fiber 221 then optically amplifies the above pulse laser light $\lambda_1$ and the pulse laser light $\lambda_2$ together, and outputs to the optical demultiplexing section 30.

The laser oscillator 1 thus configured operates as follows. In the preamplifier 21, the excitation light output from the excitation light source 212 is supplied to the rare earth element-doped optical fiber 211 via the optical coupler 213.

Also, in the main amplifier 22, the excitation light output from the excitation light source 222 is supplied to the rare earth element-doped optical fiber 221 via the optical coupler 223. In the light source section 10, the pulse laser light $\lambda_1$ is output from the first light source 11, and also the pulse laser light $\lambda_2$ is output from the second light source 12. The above pulse laser light $\lambda_1$ and the pulse laser light $\lambda_2$ are multiplexed in the optical multiplexer 13, and output from the light source section 10.

The pulse laser light $\lambda_1$ and the pulse laser light $\lambda_2$ multiplexed and output from the light source section 10 is optically amplified together in the rare earth element-doped optical fiber 211 of the preamplifier 21 in the optical amplification section 20, and further optically amplified together in the rare earth element-doped optical fiber 221 of the main amplifier 22.

The pulse laser light $\lambda_1$ and the pulse laser light $\lambda_2$ being optically amplified together in the optical amplification section 20 are mutually demultiplexed in the optical demultiplexing section 30. The pulse laser light $\lambda_1$, one output after demultiplexed in the optical demultiplexing section 30, is incident to one end of the optical fiber 51, which is then waveguided by the optical fiber 51 concerned, and output from the other end of the optical fiber 51, and collimated by the lens 61. Also, the pulse laser light $\lambda_2$, the other output after being demultiplexed in the optical demultiplexing section 30, is incident to one end of the optical fiber 52, which is then waveguided by the optical fiber 52 concerned, and output from the other end of the optical fiber 52, and collimated by the lens 62.

The pulse laser light $\lambda_1$ collimated by the lens 61 and the pulse laser light $\lambda_2$ collimated by the lens 62 are multiplexed in the optical multiplexing section 40, converged by the lens 63, so as to be collected and irradiate the processing object 2. By the above irradiation with the laser light, the processing object 2 is processed. At this time, preferably, the quality $M^2$ of the light being multiplexed and output from the optical multiplexing section 40 is 1.5 or less. The reasons that a smaller $M^2$ is preferable in precise laser processing are: (1) the beam can be collected into a smaller spot, which enables finer processing; (2) as a result of being capable of collecting in the smaller spot, beam energy density becomes higher, which enables more efficient processing.

Now, the repetition frequencies of the respective pulse laser light $\lambda_1$ and the pulse laser light $\lambda_2$ are mutually identical. Also, either of the respective pulse widths, mutual intervals and power of the pulse laser light $\lambda_1$ and the pulse laser light $\lambda_2$ at the time of being output from the light source section 10 is adjusted by the control section 14. Further, in between the optical demultiplexing section 30 and the optical multiplexing section 40, the optical path length difference between the pulse laser light $\lambda_1$ and the pulse laser light $\lambda_2$ is adjusted in the optical path length difference setting section 50. The adjustment amount of the optical path length difference is variable by the length of the fiber 52 in a macro view, and is also variable by the spatial optical path length variation section 53 in a micro view. By this, the pulse laser light being multiplexed by the optical multiplexing section 40, converged by the lens 63, and collected so as to irradiate the processing object 2 can be set to a more preferable pulse shape, pulse intervals or pulse energy. Thus, the processing object 2 can be processed with higher precision.

In the following, a more concrete configuration and an operation example of the laser light source 1 according to the present embodiment are described, and also a laser oscillation method and a laser processing method by use of the above laser light source 1 are described.

The first light source 11 includes a laser diode outputting pulse laser light having a center wavelength $\lambda_1$ of 1,080 nm. Also the second light source 12 includes a laser diode outputting pulse laser light having a center wavelength $\lambda_2$ of 1,100 nm. Each of the above first light source 11 and second light source 12 is directly modulated by injecting into each laser diode a drive current which is intensity modulated at a certain period, so as to output each pulse laser light.

When such the direct modulation is performed, there is a merit that each configuration of the first light source 11 and the second light source 12 is simple, but on the other hand, there occurs a chirping phenomenon in which the optical frequency in each output pulse of the pulse laser light fluctuates. An amount of the chirping (a fluctuating amount of the optical frequency) is determined by '0' level setting and amplitude of drive current, and physical property of the laser diode chip.

In the case that an impediment occurs due to such the chirping phenomenon at the time of demultiplexing and multiplexing in the optical multiplexer 12, the optical demultiplexing section 30 and the optical multiplexing section 40, respectively, it is preferable to perform external modulation by outputting CW laser light from the laser diode in each of the first light source 11 and the second light source 12, instead of directly modulating the laser diode. Or, it is also preferable to employ a solid laser light source using the mode lock, having Nd element or Yb element doped therein or a fiber laser light source, for each of the first light source 11 and the second light source 12.

Note that the light source section 10 is not necessary a light source section outputting pulse laser light of two wavelengths, but a light source section outputting pulse laser light of three wavelengths or more may be chosen. However, it is necessary that each pulse laser light wavelength being output from the light source section 10 be included within the range of the wavelength band in which the optical amplification section 20 has a gain. In the case that each of the rare earth element-doped optical fibers 211, 221 in the optical amplification section 20 includes Yb element as the rare earth element, since the gain band of the optical amplification section 20 ranges between 1,020 nm to 1,100 nm, it is necessary that each wavelength of the pulse laser light output from the light source section 10 be included in the range of the above gain band. Also, the interval between each wavelength of the pulse laser light output from the light source section 10 is determined by the respective optical multiplexing/demultiplexing property of the optical multiplexer 12, the optical demultiplexing section 30 and the optical multiplexing section 40. For example, in the case of four wavelengths, the values may be 1,060 nm, 1,074 nm, 1,088 nm and 1,102 nm.

Each of the first light source 11 and the second light source 12 can oscillate at a pulse frequency of 1 to 100 kHz, with an adjustable mutual oscillation interval.

Additionally, in order to realize a maximum gain exhibited by each of the preamplifier 21 and the power amplifier 22 for the pulse laser light of each wavelength, desirably, the pulse of each wavelength is not to be incident simultaneously to the optical amplification section 20. For this reason, preferably, the first light source 11 and the second light source 12 are respectively driven at an identical repetition frequency, and in different phases.

The pulse laser light output from each of the first light source 11 and the second light source 12 has a variable pulse width with from 10 ns to CW, with rated power of 400 mW at the time of oscillation. The pulse laser light $\lambda_1$ output from the first light source 11 and the pulse laser light 2 output from the second light source 12 are amplified up to the maximum of 50 dB (namely, peak power of 40 kW) by the two-stage optical amplification section 20 including the preamplifier 21 and the power amplifier 22, after being multiplexed by the optical multiplexer 13.

The above value of the peak power 40 kW enters a region in which the rare earth element-doped optical fiber 221 in the power amplifier 22 receives the influence of nonlinearity. In other words, it is not possible to increase the peak power higher than 40 kW even if the excitation light power to be supplied to the rare earth element-doped optical fibers 211, 221 is simply increased, or optical amplification is performed further by adding another stage of an identical rare earth element-doped optical fiber.

The rare earth element-doped optical fiber 221 in the main amplifier 22 is a large-diameter Yb-doped double-clad fiber (YbDF) having core NA of 0.06, core diameter of 30 μm and inner clad diameter of 350 μm, with a second clad being formed of resin of a low refractive index having a clad NA of 0.46. The rare earth element-doped optical fiber 211 in the preamplifier 21 is configured of a substantially identical structure to the rare earth element-doped optical fiber 221, but the core diameter is 8 μm and the inner clad diameter is 250 μm. The core of the fiber 211 performs transmission in the single mode at a 1-μm band. Although the fiber 221 is not operated in the single mode at the 1-μm band, since an input signal is in the single mode, a beam pattern $M^2$ of the output portion 30 becomes 1.5 or less.

The excitation light source 212 in the preamplifier 21 continuously outputs excitation light with power of 10 W and a wavelength of 978 nm. The excitation light source 222 in the power amplifier 22 also continuously outputs excitation light with power of 120 W and a wavelength of 978 nm. The pulse laser light $\lambda_1$, $\lambda_2$ optically amplified in the optical amplification section 20 is demultiplexed in the optical demultiplexing section 30. One of the demultiplexed pulse laser light $\lambda_1$ (1,080 nm) is incident to and waveguided in the optical fiber 51, while the other demultiplexed pulse laser light $\lambda_2$ (1,100 nm) is incident to and waveguided in the optical fiber 52.

The core portion of each optical fiber 51, 52 has a structure substantially identical to the core portion of the rare earth element-doped optical fiber 221 in the power amplifier 22. The core is formed of pure $SiO_2$ glass, not of double-clad structure, with NA of 0.06, core diameter of 30 μm, and clad diameter of 200 μm. The length of the optical fiber 52 is determined by a target delay time, which is preferably adjusted experimentally. Also, the delay time can be modified by preparing a plurality of optical fibers of different lengths and replacing the optical fiber 52. The above method is appropriate to modify the delay time between 10 ns and 100 μs. The pulse laser light $\lambda_1$, $\lambda_2$ waveguided in the optical fibers 51, 52 are spatially multiplexed in the optical multiplexing section 40, which is collected by the lens 63 and irradiates the processing object 2.

By mean of the spatial optical path length variation section 53 provided between the optical demultiplexing section 30 and the optical multiplexing section 40, the output end of the optical fiber 52 and the lens 62 are moved integrally in the direction of the optical axis thereof. With the above movement, an adjustment amount of the optical path length difference between the pulse laser light $\lambda_1$ and the pulse laser light $\lambda_2$ is made variable in between the optical demultiplexing section 30 and the optical multiplexing section 40. For example, if the movement amount is 15 cm, the adjustment amount of the optical path length difference is 0.5 ns. Further, pulse waveform shaping equivalent to the adjustment of the optical path length difference of ns order may also be performed by controlling the pulse oscillation timing in each of the first light source 11 and the second light source 12.

Figure 3:
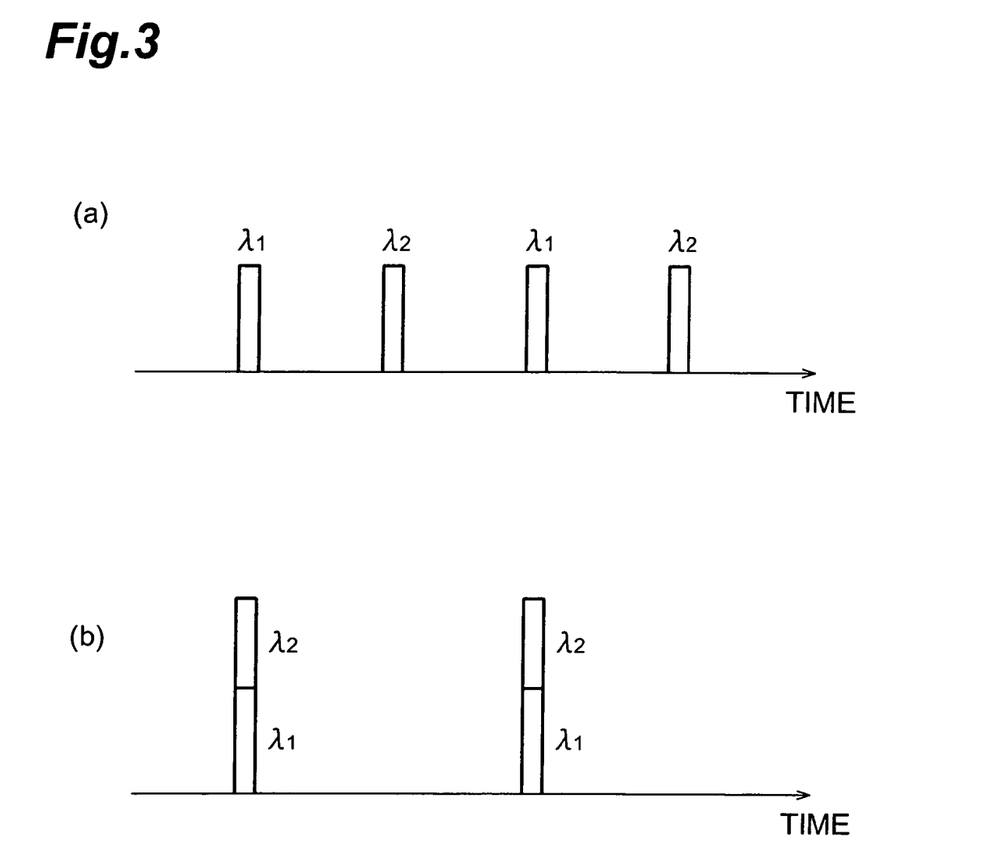
FIGS. 3A and 3B show explanation diagrams of a first operation example in the laser light source 1 according to the present embodiment.

FIGS. 3A and 3B show explanation diagrams of a first operation example in the laser light source 1 according to the present embodiment. FIG. 3A shows a pulse laser light waveform output from the optical amplification section 20. Also, FIG. 3B shows a pulse laser light waveform multiplexed and output from the optical multiplexing section 40. Here, the pulse laser light output from each of the first light source 11 and the second light source 12 was set to have a pulse repetition frequency of 50 kHz, each pulse width of 20 ns, power of 400 mW, and a mutual pulse interval of 10 μs. The power of the excitation light output from the excitation light source 212 in the preamplifier 21 was set at 10 W, while the power of the excitation light output from the excitation light source 222 in the power amplifier 22 was set at 120 W.

As shown in FIG. 3A, in the pulse laser light output from the optical amplification section 20, pulses having the wavelength $\lambda_1$ and pulses having the wavelength $\lambda_2$ alternately exist, and the repetition frequency as a whole was 100 kHz, with each pulse width of 20 ns, and each pulse energy of 0.8 mJ (calculated peak power of 40 kW).

Also, by adjusting the length of the optical fiber 52 to be approximately 2 km, a propagation time difference between the pulse laser light $\lambda_1$ and the pulse laser light $\lambda_2$ in between the optical demultiplexing section 30 and the optical multiplexing section 40 was set at 10 μs. The resultant transmission loss extending over the length of 2 km of the optical fiber 52 at a 1.1-μm wavelength band was 1.2 dB. Accordingly, as shown in FIG. 3B, the pulse laser light multiplexed in the optical multiplexing section 40 and irradiating the processing object 2 had energy of each pulse being 1.4 mJ, with each pulse width of 20 ns, a repetition frequency of 50 kHz, and calculated peak power of 70 kW.

Here, the length of the optical fiber 52 is adjusted in such a manner that pulses of each wavelength are exactly overlapped after being multiplexed in the optical multiplexing section 40. Also, a minute deviation caused by temperature change can be adjusted through the movement by means of the spatial optical path length variation section 53. In the above first operation example, the pulse laser light being output from the laser light source 1 and irradiating the processing object 2 has high peak power and high pulse energy.

Figure 4:
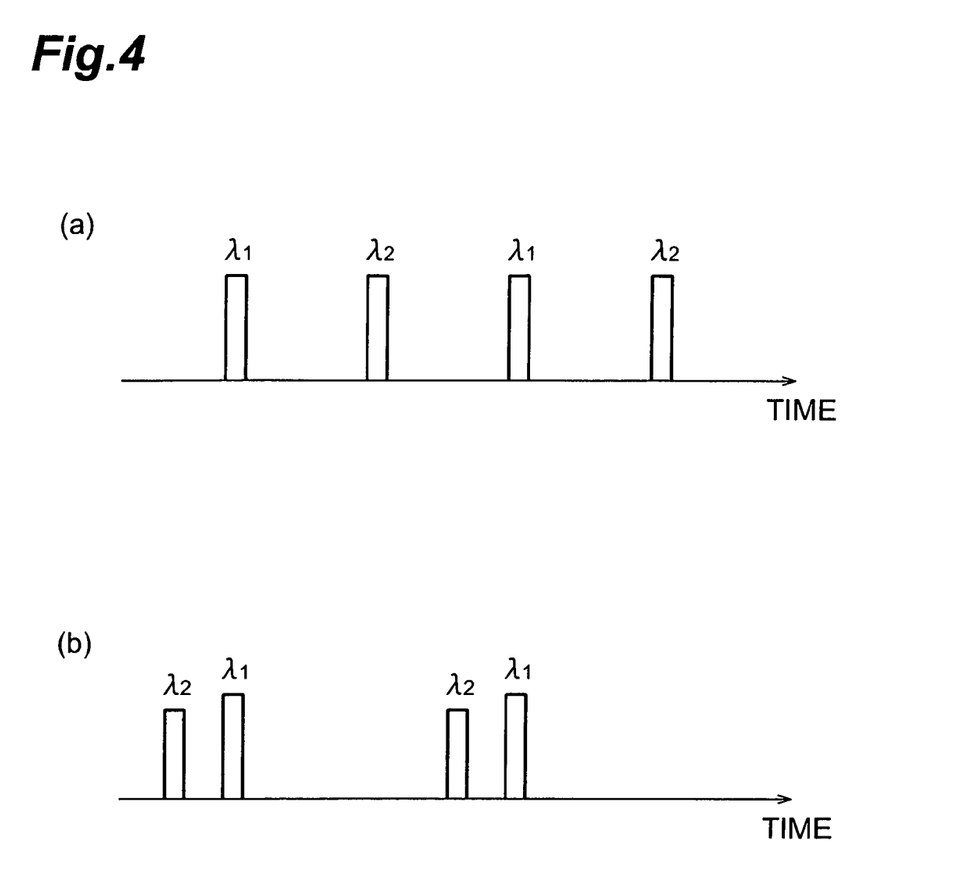
FIGS. 4A and 4B show explanation diagrams of a second operation example in the laser light source 1 according to the present embodiment.

FIGS. 4A and 4B show explanation diagrams of a second operation example in the laser light source 1 according to the present embodiment. FIG. 4A shows a pulse laser light waveform output from the optical amplification section 20. Also, FIG. 4B shows a pulse laser light waveform multiplexed and output from the optical multiplexing section 40. Operation of the respective light source section 10 and the optical amplification section 20 in the second operation example is similar to the case of the first operation example. In the second operation example, the optical fiber 52 was set to have a shorter length by 40 m. With this, the pulse of the pulse laser light $\lambda_2$ reaches the processing object 2 earlier than the pulse of the pulse laser light $\lambda_1$ by the time of 200 ns. Thus, a pulse laser of double-pulse type can be realized. Additionally, in this second operation example, the power of the preceding pulse becomes 10% lower, or on that order, by the loss in the optical fiber 52. Inversely, when it is wanted to make preceding power stronger, the length of the optical fiber 52 may well be set longer.

Further, in the repetition up to 100 kHz or on that order, time adjustment of 1 ms or less may be performed by adjusting a mutual interval of the pulse interval of the pulse laser light $\lambda_1$, $\lambda_2$. It is possible to appropriately use different ways of adjustment, such as adjusting the pulse interval when modifying the above condition frequently, or adjusting the fiber length when constantly using pulse shapes shown in FIGS. 4A, 4B, 5A, 5B, 6A, 6B, 7A and 7B.

Figure 5:
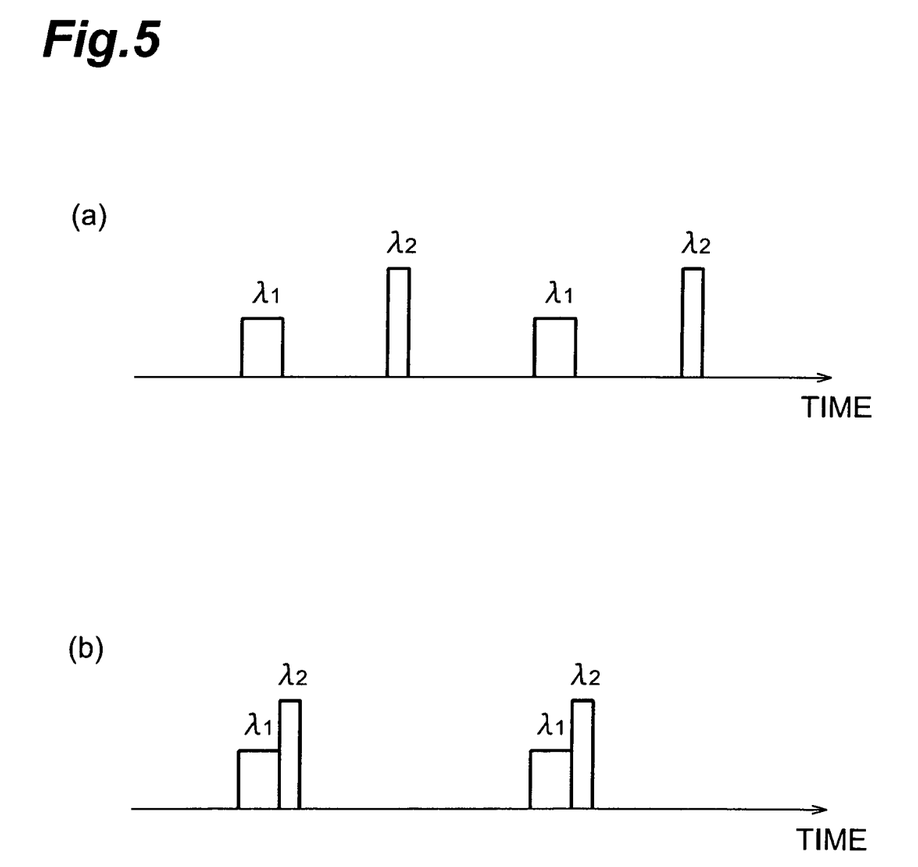
FIGS. 5A and 5B show explanation diagrams of another operation example in the laser light source 1 according to the present embodiment.
Figure 6:
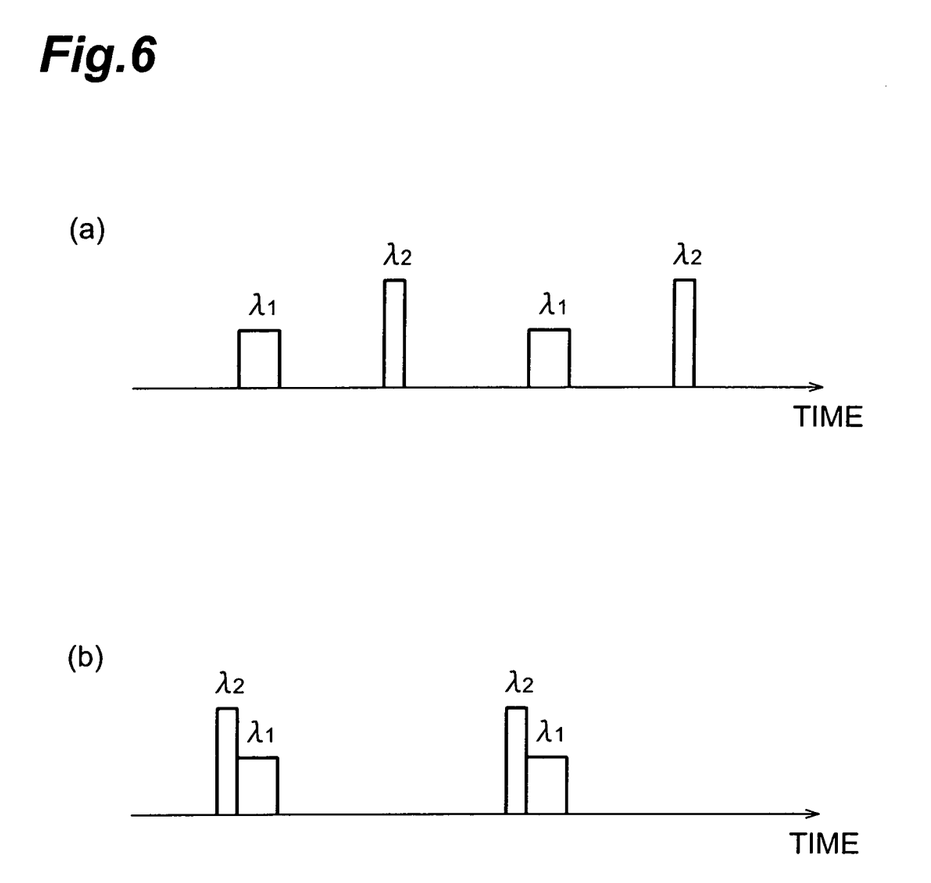
FIGS. 6A and 6B show explanation diagrams of another operation example in the laser light source 1 according to the present embodiment.
Figure 7:
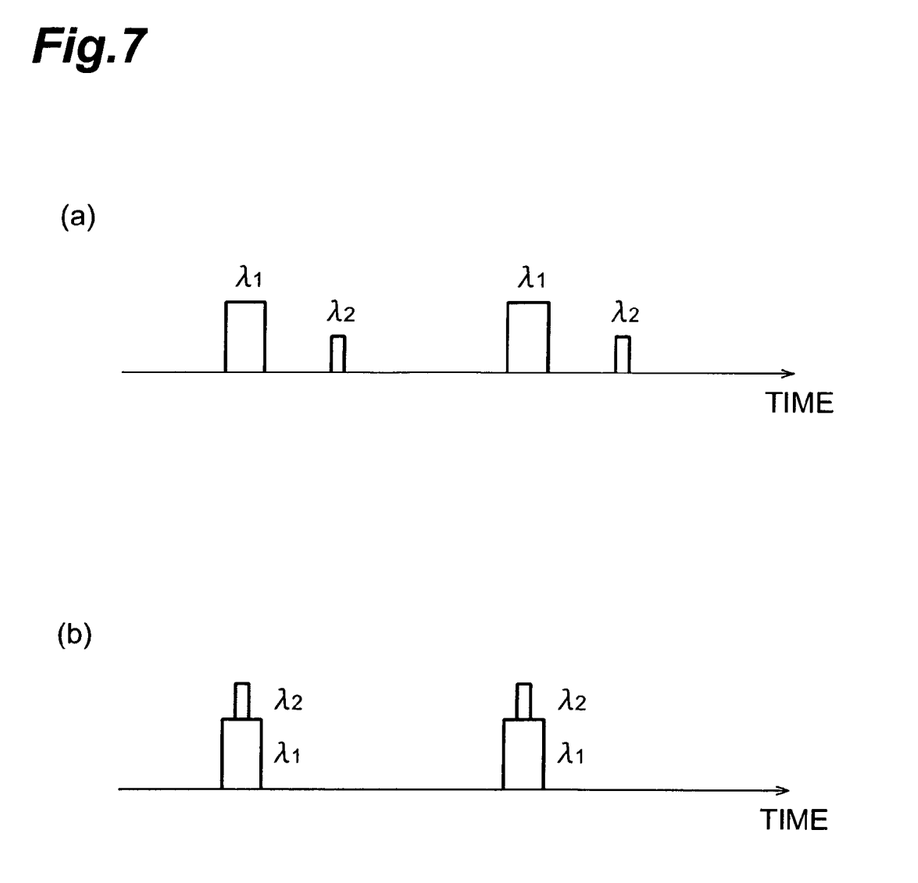
FIGS. 7A and 7B show explanation diagrams of another operation example in the laser light source 1 according to the present embodiment.

FIGS. 5A, 5B, 6A, 6B, 7A and 7B respectively show explanation diagrams of other operation examples in a laser light source 1 according to the present embodiment. FIGS. 5A, 6A and 7A show the waveforms of the pulse laser light output from the optical amplification section 20, while FIGS. 5B, 6B and 7B show the waveforms of the pulse laser light multiplexed and output from the optical multiplexing section 40.

In each of the FIGS. 5A, 5B and 6A, 6B, at the time point of being output from the light source section 10, the pulse width of the pulse laser light $\lambda_2$ was set narrower than that of the pulse laser light $\lambda_1$, and the pulse height of the pulse laser light $\lambda_2$ was set higher than that of the pulse laser light $\lambda_1$, as shown in FIG. 5A and FIG. 6A. Further, by appropriately adjusting the mutual pulse interval of the pulse laser light $\lambda_1$, $\lambda_2$, or the length of the optical fiber 52, or the position of the spatial optical path length variation section 53 at the time of being output from the light source section 10, it was possible that each pulse of the pulse laser light being multiplexed in the optical multiplexing section 40 and irradiating the processing object 2 had a shape having smaller power in the former portion and larger power in the latter portion (FIG. 5B), or a shape having larger power in the former portion and smaller power in the latter portion (FIG. 6B).

Also, as shown in FIG. 7A, at the time point of being output from the light source section 10, the pulse width of the pulse laser light $\lambda_2$ was set narrower than that of the pulse laser light $\lambda_1$, and the pulse height of the pulse laser light $\lambda_2$ was set higher than that of the pulse laser light $\lambda_1$. Further, by appropriately adjusting the mutual pulse interval of the pulse laser light $\lambda_1$, $\lambda_2$, the length of the optical fiber 52, or the position of the spatial optical path length variation section 53 when being output from the light source section 10, it was possible that each pulse of the pulse laser light being multiplexed in the optical multiplexing section 40 and irradiating the processing object 2 had a shape having smaller power in the former and latter portions, and larger power in the central portion (FIG. 7B).

As shown in these FIGS. 5A, 5B, 6A, 6B, 7A and 7B, by modifying the oscillation power and the oscillation time of the respective first light source 11 and the second light source 12, the oscillation interval therebetween and the length of the optical fiber 52, each pulse shape of the pulse laser light output from the laser light source 1 can be modified freely.

Incidentally, an amplification factor in the optical amplification section 20 depends on the inverted population of each of the rare earth element-doped optical fibers 211, 221. When the inverted population is maintained in a state close to one, the amplification becomes 50 dB at the maximum, whereas the amplification factor reduces when the inverted population is low. Using the above principle, if the oscillation interval of each of the first light source 11 and the second light source 12 is set unequal, the amplification factor of the each pulse can be modified.

So far, the description has been made on the pulse laser light having two wavelengths $\lambda_1$, $\lambda_2$. However, the present invention is applicable to cases of three wavelengths or more. For example, the following shows the case of four wavelengths.

A typical value of the transmission loss of the optical fiber 52 is 0.6 dB/km (at a wavelength of 1.06 μm-1.10 μm), and a delay time of 10 μs can be realized using a fiber of approximately 2 km in length. Also, a delay time of 30 μs can be realized using a fiber of approximately 6 km in length. In the latter case, since a loss of 3.6 dB is produced, the efficiency is degraded correspondingly. However, by shifting each of the four pulse laser lights mutually by 10 μs with a pulse repetition frequency of 25 kHz, as a whole, the repetition frequency becomes 100 kHz when neglecting the wavelength, with a pulse width of 20 ns, pulse energy of 0.8 mJ (80 W, with calculated peak power of 40 kW). Thus, even in the case of multiplexing the above four waves, a total energy loss is 1.6 dB, which is tolerable as compared with the convenience obtained therefrom.

Representing another way, by use of the above system, it is possible to use pulse laser light having pulse energy of 0.8 mJ (80 W, with calculated peak power of 32 kW) with a repetition frequency of 100 kHz, as pulse laser light having pulse energy of 2.2 mJ (55 W, with calculated peak power of 110 kW) with a repetition frequency of 25 kHz. In such a manner, laser having high peak power and high pulse energy can be generated.

When using in a region in which nonlineariry occurs, it is not possible to efficiently use excitation light power of the excitation light sources 213, 223 without using the optical fiber 52. Also, it is understood that laser having higher peak power can be generated when outputting four-wavelength pulse laser light, than outputting two-wavelength pulse laser light in the light source section 10.

The present invention is not limited to the aforementioned embodiment, but a variety of modifications may be possible. For example, the light source section 10 may include a plurality of sets of CW laser light sources and modulators, a single multi-wavelength laser light source, or may be a laser light source which divides the output light from a single wideband laser light source into a plurality of wavelengths. Also, the optical amplification section 20 may be replaced with an amplifier using a slab waveguide.

Figure 8:
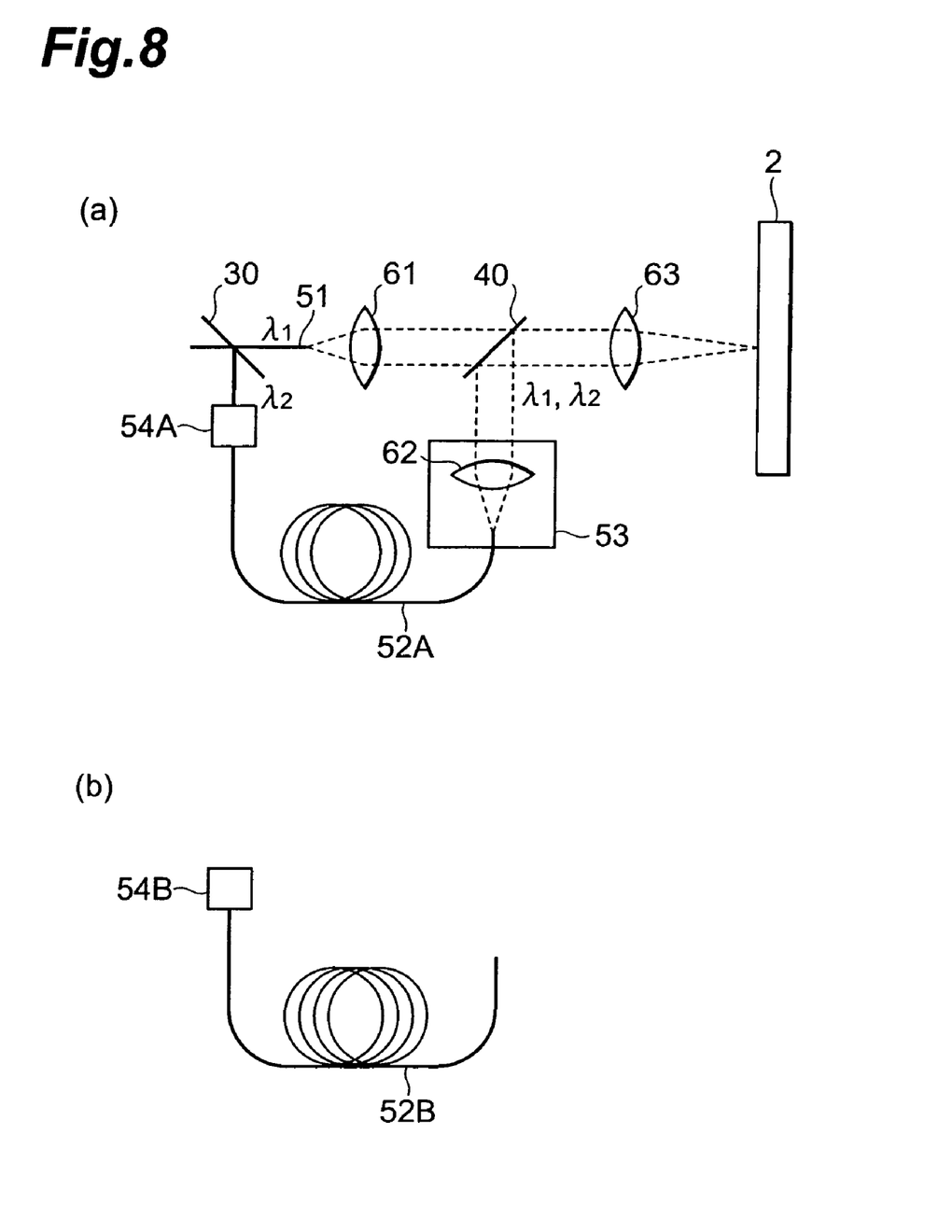
FIGS. 8A and 8B show diagrams illustrating another configuration example of an optical path length difference setting section included in the laser light source 1 according to the present embodiment.

Further, in the above-mentioned embodiment, the optical path length difference setting section includes the optical fiber 51 and the optical fiber 52 having different lengths, and the spatial optical path length variation section 53 are included. However, the present invention is not limited thereto. The optical path length difference setting section may have a configuration, for example, shown in FIG. 8 or FIG. 9.

The optical path length difference setting section shown in FIGS. 8A and 8B can adjust the optical path length difference by replacing the optical fiber 52A (FIG. 8A) disposed in one optical path between the optical demultiplexing section 30 and the optical multiplexing section 40 with another optical fiber 52B (FIG. 8B) having a different length therefrom. In order to perform the above replacement easily, a connector 54A is provided on one end of the optical fiber 52A, and also, a connector 54B is provided on one end of the optical fiber 52B.

Figure 9:
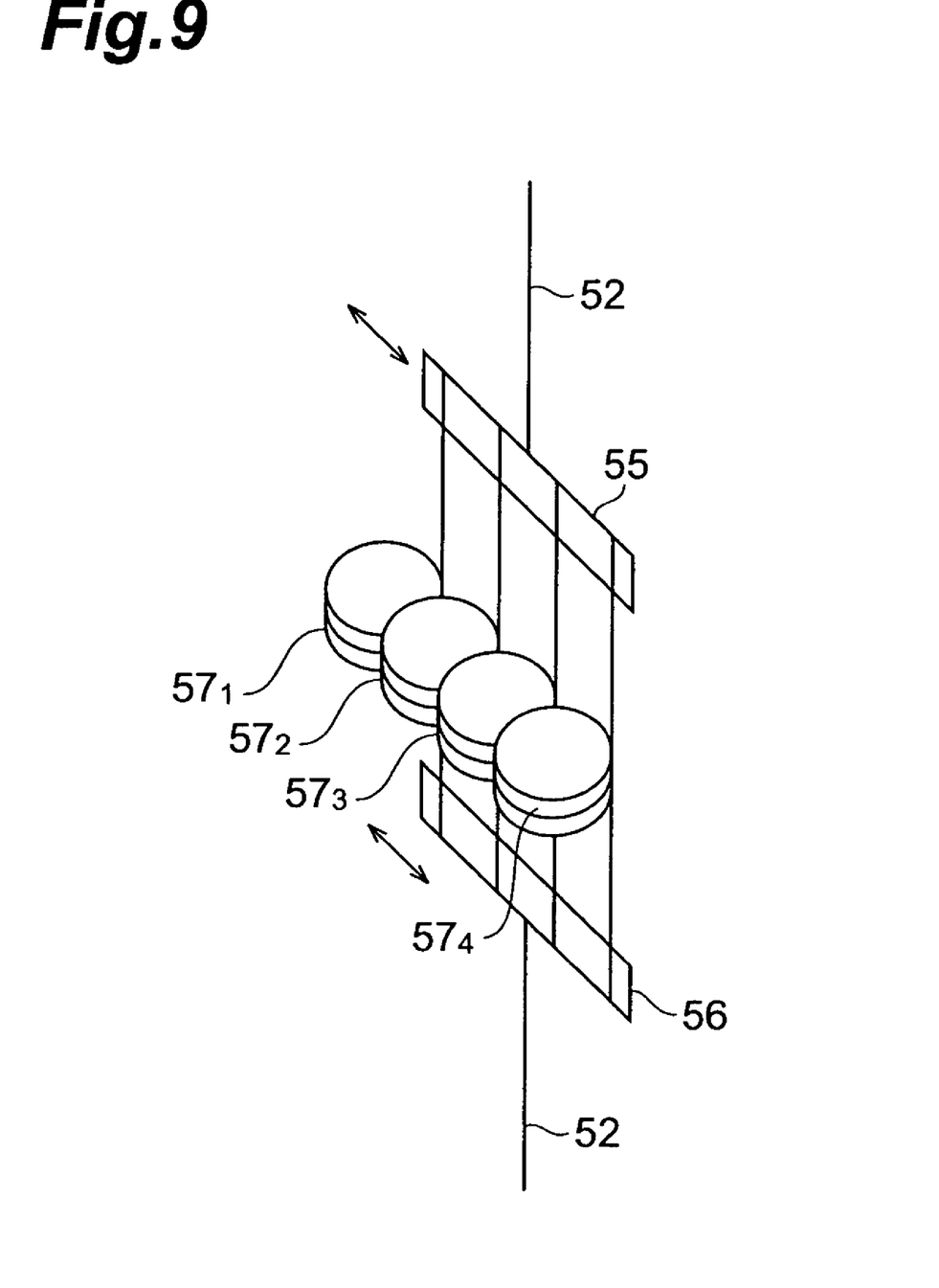
FIG. 9 shows a diagram illustrating still another configuration example of an optical path length difference setting section included in the laser light source 1 according to the present embodiment.

The optical path length difference setting section shown in FIG. 9 includes an optical fiber selector 55, an optical fiber selector 56, and a plurality of (four in the figure) delay optical fibers $57_1$-$57_4$ mutually having different optical path lengths disposed between the above optical fiber selectors 55, 56, which are disposed in the halfway of the optical fiber 52 existent in one optical path in between the optical demultiplexing section 30 and the optical multiplexing section 40. Each of the two optical fiber selectors 55, 56 is a fiber-moving-type switch, which can optically connect either one delay optical fiber out of the four delay optical fibers $57_1$-$57_4$ by the movement thereof, and thereby the optical path length difference can be adjusted.

The optical path length difference is adjustable either online or offline. The offline adjustment may be performed, for example, by simply disposing a measuring instrument in place of the processing object 2. In this case, the measuring instrument is prevented from damage either by suppressing output power or inserting an ND filter. The online adjustment may be performed, for example, by inserting an optical branching device (a half mirror) between the optical multiplexing section 40 and the lens 63, and providing a measuring instrument for receiving the light branching from the optical branching device. Further, the online adjustment may also be performed by inserting tap couplers immediately before the respective optical fibers 51, 52, and providing a measuring instrument for receiving light branching from the above tap couplers. A branching ratio of the optical branching device or each the tap coupler may be on the order of 1:1,000. By feeding back the above result to the control section, it is possible to control an influence of temperature fluctuation, etc.

Figure 10:
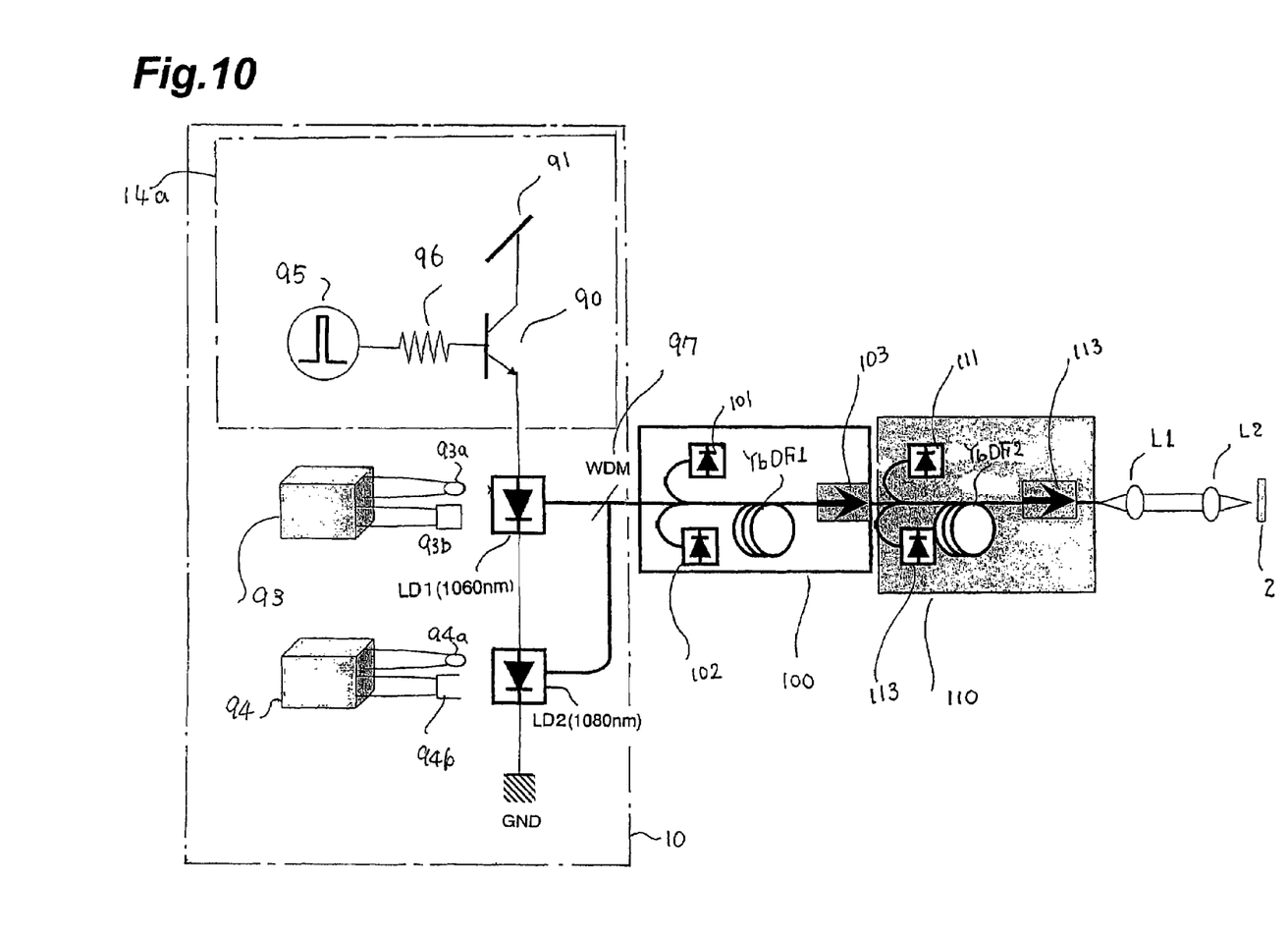
FIG. 10 shows a configuration diagram of another laser light source 1 according to the present embodiment.

FIG. 10 shows another configuration diagram of the laser light source 1 according to the present embodiment. In FIG. 10, an LD1 (1,060 nm) and an LD2 (1,080 nm) output light respectively having different wavelengths (1,060 nm, 1,080 nm). A temperature control section is provided in each LD1, LD2, which is constituted of temperature control circuit 93, 94, thermistor 93*a*, 94*a*, and Peltier element 93*b*, 94*b*. Also, as shown in FIG. 10, a pulse modulation circuit 14*a* for supplying pulse signals to LD1, LD2 includes a pulse signal source 95, a drive transistor 90, a constant voltage power supply 91 connected to the collector of the drive transistor 90, and a base resistor 96 provided between the pulse signal source 95 and the base of the drive transistor 90. The pulse modulation circuit 14*a* corresponds to the control section 14 shown in FIG. 1. Further, the above LD1, LD2 are connected in series (namely, the cathode of the LD1 is connected to the anode of the LD2), which are driven by a common current from the emitter of the drive transistor 90, being supplied from the constant voltage power supply 91 via the drive transistor 90. The current supplied to both LD1, LD2 from the drive transistor 90 is modulated by the pulse signal source 95. Ordinarily, the inter-terminal voltage of LD in the forward direction is as low as less than 2 V. On the other hand, the voltage of a general low-voltage power supply is set at 5 V, or on that order. Therefore, in the case of an ordinary LD having the drive current versus optical output characteristic of a small performance difference in a threshold current and differentiation efficiency, it is possible to perform pulse modulation by connecting two LDs in series. In this case, since only one pulse signal source 95, as well as one drive transistor 90, is required, there is a merit capable of reducing size, cost and power consumption of the light source section 10. The output light of LD1, LD2 is multiplexed in a WDM coupler 97, and successively input to a preamplifier 100 and a power amplifier 110. The preamplifier 100 and the power amplifier 110 are configured such that two excitation light sources 101, 102 and 111, 112 (of which number is not restricted), which output excitation light of CW light to Yb-doped fibers YbDF1, YbDF2 (double-clad fibers) functioning as amplifying optical fibers, respectively supplies excitation light via couplers for generating composite excitation light. The light output from the Yb-doped fibers is output via isolators 103, 113. The light output from the power amplifier 110 is irradiated on the work 2, an irradiation object, from an optical system constituted of two lenses L1, L2.

Further, by amplifying the outputs of the two light sources or more, mutually having different wavelengths, inside the optical fiber amplifier, an effect capable of suppressing stimulated Brillouin scattering (SBS), a kind of a fiber nonlinearity effect, is obtained because of spread wavelength component even when the output light power is identical, as compared to the case of the light to be amplified having a single wavelength component. Though the nonlinearity phenomenon occurs most remarkably in the vicinity of an output end of a booster amplifier, if there are, for example, two wavelength components, the power of each wavelength component is reduced to approximately a half as compared to the case of a saturation output of the booster amplifier having one wavelength component, and the stimulated Brillouin scattering is also reduced.

Through the exemplary embodiment according to the present invention, more precise laser processing can be performed.

What is claimed is:

1. A laser light source comprising:
   a light source section outputting a first pulse laser light of a first wavelength having a first pulse period and a second pulse laser light of a second wavelength having a second pulse period, respectively;
   an optical amplification section for amplifying and outputting the first pulse laser light and the second pulse laser light being output from the light source section by means of a common optical amplification medium;
   an optical demultiplexing section for mutually demultiplexing the first pulse laser light and the second pulse laser light being output from the optical amplification section;
   an optical multiplexing section for multiplexing and outputting the first pulse laser light and the second pulse laser light being demultiplexed in the optical demultiplexing section; and
   an optical path length difference setting section for setting an optical path length difference between a first optical path for the first pulse laser light and a second optical path for the second pulse laser light between the optical demultiplexing section and the optical multiplexing section;
   wherein the optical path length difference setting section comprises a variable optical-path length difference adjusting section by which an adjustment amount of the optical path length difference is variable.

2. The laser light source according to claim 1,
   wherein the light source section comprises:
   a first light source for outputting the first pulse laser light of the first wavelength;
   a second light source for outputting the second pulse laser light of the second wavelength; and
   an optical multiplexer for multiplexing and outputting the first pulse laser output from the first light source and the second pulse laser output from the second light source.

3. The laser light source according to claim 1,
   wherein the light source section comprises a mode-locked fiber laser light source.

4. The laser light source according to claim 1,
   wherein the light source section comprises an oscillation interval control mechanism controlling input timing of the first pulse laser light and the second pulse laser light to be input to the optical amplification section.

5. The laser light source according to claim 1,
   wherein the optical amplification section is a rare earth element-doped optical fiber amplifier.

6. The laser light source according to claim 1,
   wherein the optical multiplexing section multiplexes the first pulse laser light and the second pulse laser light after being spatially propagated.

7. The laser light source according to claim 1,
   wherein the optical amplification section comprises an optical fiber having one propagation mode in number in the first wavelength and the second wavelength, and the quality $M^2$ of the light multiplexed and output from the optical multiplexing section is 1.5 or less.

8. The laser light source according to claim 1,
wherein the optical path length difference setting section comprises an optical waveguide for adjusting an optical path length in at least a portion of at least of the first optical path and the second optical path.

9. A laser oscillation method comprising the steps of:
outputting a first pulse laser light of a first wavelength having a first pulse frequency and a second pulse laser light of a second wavelength having a second pulse frequency from a light source section;
in an optical amplification section, amplifying and outputting the first pulse laser light and the second pulse laser light being output from the light source section by a common optical amplification medium;
mutually demultiplexing in an optical demultiplexing section the first pulse laser light and the second pulse laser light being output from the optical amplification section;
in an optical path length difference setting section, setting an optical path length difference between a first optical path for the first pulse laser light and a second optical path for the second pulse laser light being demultiplexed in the optical demultiplexing section; and
in an optical multiplexing section, multiplexing and outputting the first pulse laser light and the second pulse laser light,
wherein the first pulse laser light and the second pulse laser light being multiplexed have different optical path lengths between the optical demultiplexing section and the optical multiplexing section, the different optical path length being set in the optical path length difference setting section.

10. The laser oscillation method according to claim 9, further comprising the steps of:
outputting from the optical demultiplexing section the first pulse laser light and the second pulse laser light at mutually different timing; and
outputting from the optical multiplexing section the first pulse laser light and the second pulse laser light at such timing that at least portions thereof mutually overlap.

11. The laser oscillation method according to claim 9,
wherein a shape of pulse group multiplexed with the first pulse laser light and the second pulse laser light and output from the optical multiplexer is formed to a desired shape by adjusting at least one of the respective pulse widths, power and output timing of the first pulse laser light and the second pulse laser light being output from the light source section.

12. The laser oscillation method according to claim 9,
wherein a shape of pulse group multiplexed with the first pulse laser light and the second pulse laser light and output from the optical multiplexer is modified by adjusting the setting of the optical path length difference in the optical path length difference setting section.

13. A laser processing method for processing a processing object by irradiating the processing object with pulse laser light being output by means of the laser oscillation method according to claim 9.

14. A laser processing method for processing a processing object by irradiating the processing object with pulse laser light being output by means of the laser oscillation method according to claim 10.

15. A laser processing method for processing a processing object by irradiating the processing object with pulse laser light being output by means of the laser oscillation method according to claim 10.

16. A laser processing method for processing a processing object by irradiating the processing object with pulse laser light being output by means of the laser oscillation method according to claim 12.

17. The laser light source according to claim 1, wherein a desired pulse shape of pulse laser light multiplexed by the optical multiplexing section is formed, at a pulse period defined by the first pulse period and the second pulse period, by a group of pulses in a plurality of the pulse laser lights consisting of the first pulse laser light and the second pulse laser light in the pulse period defined by the first pulse period and the second pulse period.

18. The laser oscillation method according to claim 9, wherein a shape of a pulse group of pulse laser light multiplexed by the optical multiplexing section is formed to a desired shape, at a pulse period defined by the first pulse period and the second pulse period, by using a group of pulses in a plurality of the pulse laser lights consisting of the first pulse laser light and the second pulse laser light in the pulse period defined by the first pulse period and the second pulse period.

19. The laser light source according to claim 1, further comprising a lens for receiving the pulse laser light multiplexed by the optical multiplexing section and for irradiating the received pulse laser light to an object to be processed.

20. The laser light source according to claim 1, wherein the first pulse period is the same as the second pulse period.

* * * * *